United States Patent
Oak et al.

(10) Patent No.: US 10,050,625 B2
(45) Date of Patent: Aug. 14, 2018

(54) TECHNIQUES AND DEVICES FOR LEVEL-SHIFTING A SIGNAL

(71) Applicant: Empower Semiconductor, Inc., Fremont, CA (US)

(72) Inventors: Parag Oak, Sunnyvale, CA (US); David Lidsky, Oakland, CA (US)

(73) Assignee: Empower Semiconductor, Inc., Fremont, CA (US)

( * ) Notice: Subject to any disclaimer, the term of this patent is extended or adjusted under 35 U.S.C. 154(b) by 0 days.

(21) Appl. No.: 14/634,142

(22) Filed: Feb. 27, 2015

(65) Prior Publication Data

US 2016/0254815 A1    Sep. 1, 2016

(51) Int. Cl.
*H03K 19/0175* (2006.01)
*H03K 19/0185* (2006.01)

(52) U.S. Cl.
CPC .......................... *H03K 19/018528* (2013.01)

(58) Field of Classification Search
CPC ..... H03K 19/018521; H03K 3/356113; H03K 19/00315; H03K 19/018535; G11C 8/08
See application file for complete search history.

(56) References Cited

U.S. PATENT DOCUMENTS

| | | | | |
|---|---|---|---|---|
| 7,282,954 | B2* | 10/2007 | Quinn | H03K 19/018521 326/68 |
| 7,400,279 | B2* | 7/2008 | Krymski | H03M 1/0607 327/54 |
| 2007/0182447 | A1* | 8/2007 | Quinn | H03K 19/018521 326/68 |
| 2008/0007314 | A1* | 1/2008 | Ricard | H03K 3/356113 327/333 |
| 2008/0285359 | A1* | 11/2008 | De Sandre | G11C 7/1051 365/189.11 |
| 2013/0009800 | A1* | 1/2013 | Yang | H03K 5/2481 341/155 |

* cited by examiner

*Primary Examiner* — Long Nguyen
(74) *Attorney, Agent, or Firm* — Goodwin Procter LLP

(57) ABSTRACT

Techniques and devices for level-shifting a signal are described. A level-shifting circuit may include an input terminal and components. The input terminal may be configured to receive a logical signal compatible with a first power domain. The components may be configured to convert the logical signal to a second power domain and to provide the converted logical signal at an output terminal. The components may include a resistive device coupled between the output terminal and the input terminal, and/or a capacitive device coupled between the resistive device and the input terminal.

22 Claims, 6 Drawing Sheets

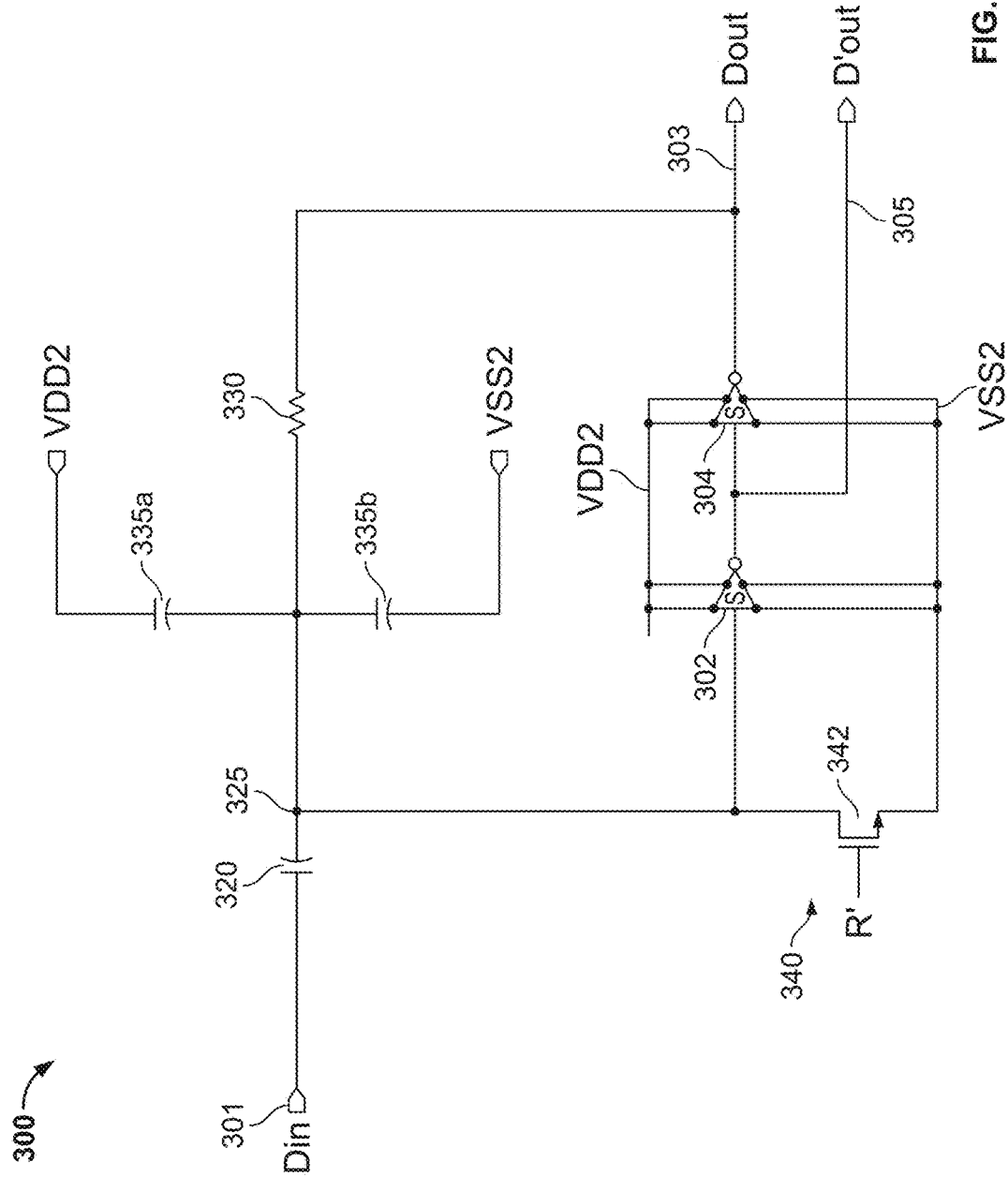

TECHNIQUES AND DEVICES FOR LEVEL-SHIFTING A SIGNAL

FIELD OF INVENTION

The invention relates generally to techniques and devices for level-shifting a signal. Some embodiments relate specifically to techniques and devices for enhancing the speed of level-shifting.

BACKGROUND

A level-shifter circuit (sometimes referred to as a level-shifting circuit, level-shifter, level-translation circuit, level-translator, etc.) converts a signal (e.g., a digital signal) from a level (e.g., voltage level) compatible with one voltage domain to a level compatible with another voltage domain. It is not uncommon for an electronic device to include two or more communicatively coupled electrical circuits in different voltage domains. A voltage domain may be characterized by the electrical potentials of the power supply rails provided to circuits in the voltage domain (e.g., VDD and VSS), and/or by the potential difference between a digital signal representing a logic-1 value and a digital signal representing a logic-0 value in the voltage domain. When a digital signal compatible with a first voltage domain is provided to a second voltage domain, circuit components in the second voltage domain may not be able to reliably determine whether the digital signal's voltage represents a logic-1 value or a logic-0 value in the second voltage domain.

A level-shifter circuit may be coupled between circuits in different voltage domains, and may be operable to convert a digital signal representing a logic value in the first voltage domain to a digital signal representing the same logic value in the second voltage domain. The level-shifter circuit may convert the digital signal by shifting the digital signal's voltage.

SUMMARY OF THE INVENTION

According to an aspect of the present disclosure, a level-shifter circuit is provided. The level-shifter circuit comprises an input terminal and a plurality of components. The input terminal is configured to receive a logical signal compatible with a first power domain. The plurality of components is configured to convert the logical signal to a second power domain and to provide the converted logical signal at an output terminal. The plurality of components includes a resistive device coupled between the output terminal and the input terminal. In some embodiments, the resistive device is capacitively coupled to the input terminal.

In some embodiments, the plurality of components further includes a capacitive component coupled between the resistive device and the input terminal.

According to another aspect of the present disclosure, a level-shifter circuit is provided, comprising first and second field-effect transistors (FETs) of a first type, a first capacitive device, a second capacitive device, third and fourth FETs, a first resistive device, and a second resistive device. The first and second FETs are of a first type, and source terminals of the first and second FETs are configured to couple to a voltage supply at a first potential. The first capacitive device is coupled between a gate terminal of the first FET and a first differential input terminal of the level-shifter circuit. The second capacitive device is coupled between a gate terminal of the second FET and a second differential input terminal of the level-shifter circuit. The third and fourth FETs are of a second type and are coupled to form a cross-coupled transistor pair. A drain terminal of the third FET is coupled to a gate terminal of the fourth FET. A drain terminal of the fourth FET is coupled to a gate terminal of the third FET. Source terminals of the third and fourth FETs are configured to couple to a voltage supply at a second potential. The first resistive device is coupled between the drain terminal of the third FET and the gate terminal of the second FET. The second resistive device is coupled between the drain terminal of the fourth FET and the gate terminal of the first FET.

According to another aspect of the present disclosure, a level-shifter circuit is provided, comprising first and second inverters, a resistive device, and a first capacitive device. An output terminal of the first inverter is coupled to an input terminal of the second inverter. The resistive device is coupled between an input terminal of the first inverter and an output terminal of the second inverter. The first capacitive device is coupled between the input terminal of the first inverter and an input terminal of the level-shifter circuit.

Other aspects and advantages of the invention will become apparent from the following drawings, detailed description, and claims, all of which illustrate the principles of the invention, by way of example only.

BRIEF DESCRIPTION OF THE DRAWINGS

Advantages of the invention may be understood by referring to the following description taken in conjunction with the accompanying drawings. In the drawings, like reference characters generally refer to the same parts throughout the different views. Also, the drawings are not necessarily to scale, emphasis instead generally being placed upon illustrating the principles of the invention.

FIG. 3 is a schematic of another level-shifter circuit, according to some embodiments.

DETAILED DESCRIPTION

Figure 1:
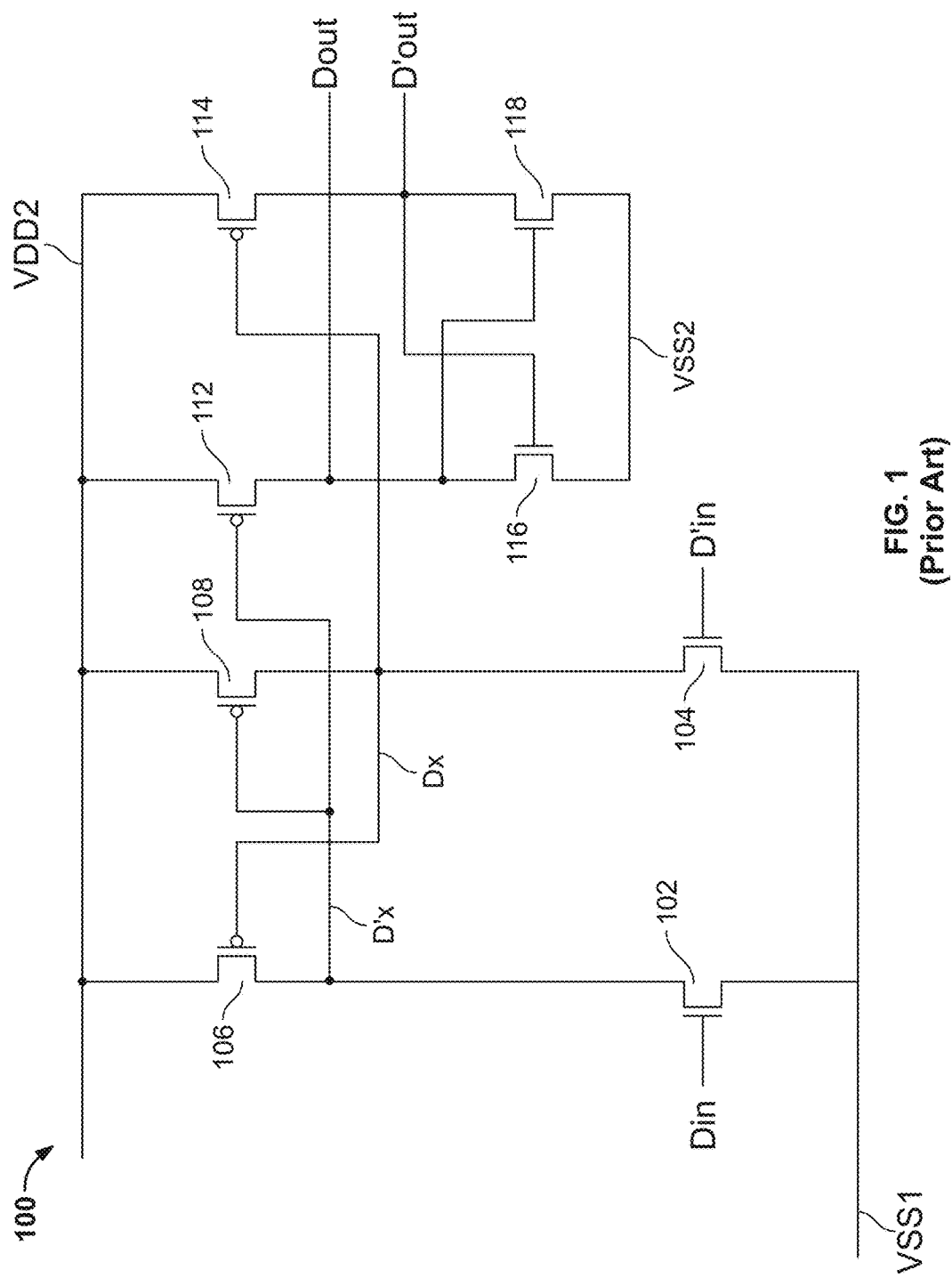
FIG. 1 is a schematic of a conventional level-shifter circuit.

FIG. 1 shows a schematic of a conventional level-shifting circuit 100. Level-shifting circuit 100 is a multi-stage level-shifter, with an input stage and an output stage. The first (input) stage of circuit 100 includes a pair of n-type metal-oxide semiconductor (NMOS) field-effect transistors (FETs) (102, 104) and a cross-coupled pair of p-type MOSFETs (106, 108). The NFETs of the first stage receive input signals compatible with a first voltage domain, and the PFETs of the first stage operate to "pull up" the voltage of the level-shifted signals to VDD2, the supply voltage of a second voltage domain. The second (output) stage of circuit 100 includes a pair of PFETs (112, 114) and a cross-coupled pair of NFETs (116, 118). The PFETs of the second stage receive the signals provided by the first stage, and the NFETs of the second stage operate to "pull down" the voltage of the level-shifted signals to VSS2, the ground voltage of the second voltage domain. Thus, level-shifting circuit 100 converts input signals from a first voltage domain (VDD1, VSS1) to a second voltage domain (VDD2, VSS2). The operation of circuit 100 is described in more detail below.

A differential pair of input signals (Din and Din') are provided at the gate terminals of the first-stage NFETs (102 and 104, respectively). The input signals are compatible with a first voltage domain in which the power supply rail voltages are VDD1 and VSS1. The electrical potentials that represent logic-0 and logic-1 in the first voltage domain may be VSS1 and VDD1, respectively.

As can be seen, the sources of the first-stage NFETs (102, 104) are coupled to the ground rail (VSS1) of the first voltage domain, and the drains of the NFETs (102, 104) are coupled to the respective drains of the cross-coupled PFETs (106, 108). The gate of PFET 106 is coupled to the drains of PFET 108 and NFET 104, and the gate of PFET 108 is coupled to the drains of PFET 106 and NFET 102. The sources of PFETs 106 and 108 are coupled to the supply rail VDD2 of the second voltage domain.

The total voltage drop across the stacked pairs of first-stage NFETs (102, 104) and PFETs (106, 108) may be as large as VDD2 (the supply voltage of the second voltage domain) minus VSS1 (the ground voltage of the first voltage domain). Thus, when PFET 106 is switched on and NFET 102 is switched off, the voltage across the drain-source terminals of NFET 102 may be VDD2-VSS1. One of ordinary skill in the art will appreciate that the voltage across the drain-source terminals of FET 102, 104, 106, or 108 can be as high as VDD2-VSS1 during the operation of level-shifting circuit 100. To accommodate the relatively large voltage drop, these first-stage FETs may be implemented as input/output (I/O) FETs (e.g., these FETs may be implemented in the I/O logic processing steps of a semiconductor fabrication process, rather than in the core logic processing steps). As such, these first-stage FETs may be able to withstand relatively large voltage drops, but may be considerably slower than core logic FETs.

The differential pair of partially level-shifted signals (Dx, Dx') produced by the first stage of circuit 100 are provided at the gate terminals of the second-stage PFETs (114 and 112, respectively). Since the voltage across the gate-source terminals of the second-stage PFETs may be as high as VDD2-VSS1, PFETs 112 and 114 may be implemented as I/O FETs. Thus, FETs 102, 104, 106, 108, 112, and 114 may all be I/O FETs.

As can be seen, the source terminals of the second-stage PFETs (112, 114) are coupled to the supply rail (VDD2) of the second voltage domain, and the drains of the PFETs (112, 114) are coupled to the respective drains of a cross-coupled pair of NFETs (116, 118). The gate of NFET 116 is coupled to the drains of PFET 114 and NFET 118, and the gate of NFET 118 is coupled to the drains of PFET 112 and NFET 116. The sources of NFETs 116 and 118 are coupled to the ground rail VSS2 of the second voltage domain. Thus, the total voltage drop across the drain-source terminals of the stacked pairs of second-stage NFETs (116, 118) and PFETs (112, 114) may be as high as VDD2 (the supply voltage of the second voltage domain) minus VSS2 (the ground voltage of the second voltage domain).

The output signals (Dout, Dout') provided by circuit 100 are compatible with the second voltage domain, in which the power supply rail voltages are VDD2 and VSS2. The electrical potentials that represent logic-0 and logic-1 in the second voltage domain may be VSS2 and VDD2, respectively.

Level-shifting circuit 100 may be too slow for some applications. Implementing the FETs of the first stage of circuit 100 using I/O FETs limits the switching speed of circuit 100. Furthermore, the worst-case delay through circuit 100 includes the switching speeds of four transistors (two I/O FETs from the first stage and two FETs from the second stage). Faster level-shifting circuits are needed for some applications, including, but not limited to, power train devices and/or devices in which multiple level-shifting circuits are coupled in series (e.g., switching regulators).

The inventors have recognized and appreciated that the switching speed of a level-shifting circuit may be enhanced by coupling the circuit's input and output terminals to each other. Coupling the level-shifting circuit's input terminal to its output terminal may introduce feed-forward effects into the circuit, may facilitate a reduction in the number of switching delays along the longest path through the circuit, and/or may facilitate implementation of the level-shifting circuit's transistors in core logic CMOS.

In some embodiments, a fast level-shifting circuit may include an input terminal that receives a logical signal from a first power domain, and components that convert the logical signal to a second power domain and provide the converted logical signal at an output terminal. The components may include a resistive device and/or a capacitive device coupled between the output terminal and the input terminal. In some embodiments, the capacitive device may be coupled between the input terminal and the resistive device, and the resistive device may be coupled between the output terminal and the capacitive device. In some embodiments, the fast level-shifting circuit may operate reliably at frequencies as high as or higher than 10 GHz-200 GHz (e.g., in a 28 nm technology node).

The various aspects described above, as well as further aspects, will now be described in detail below. It should be appreciated that these aspects may be used alone, all together, or in any combination of two or more, to the extent they are not mutually exclusive.

Figure 2A:
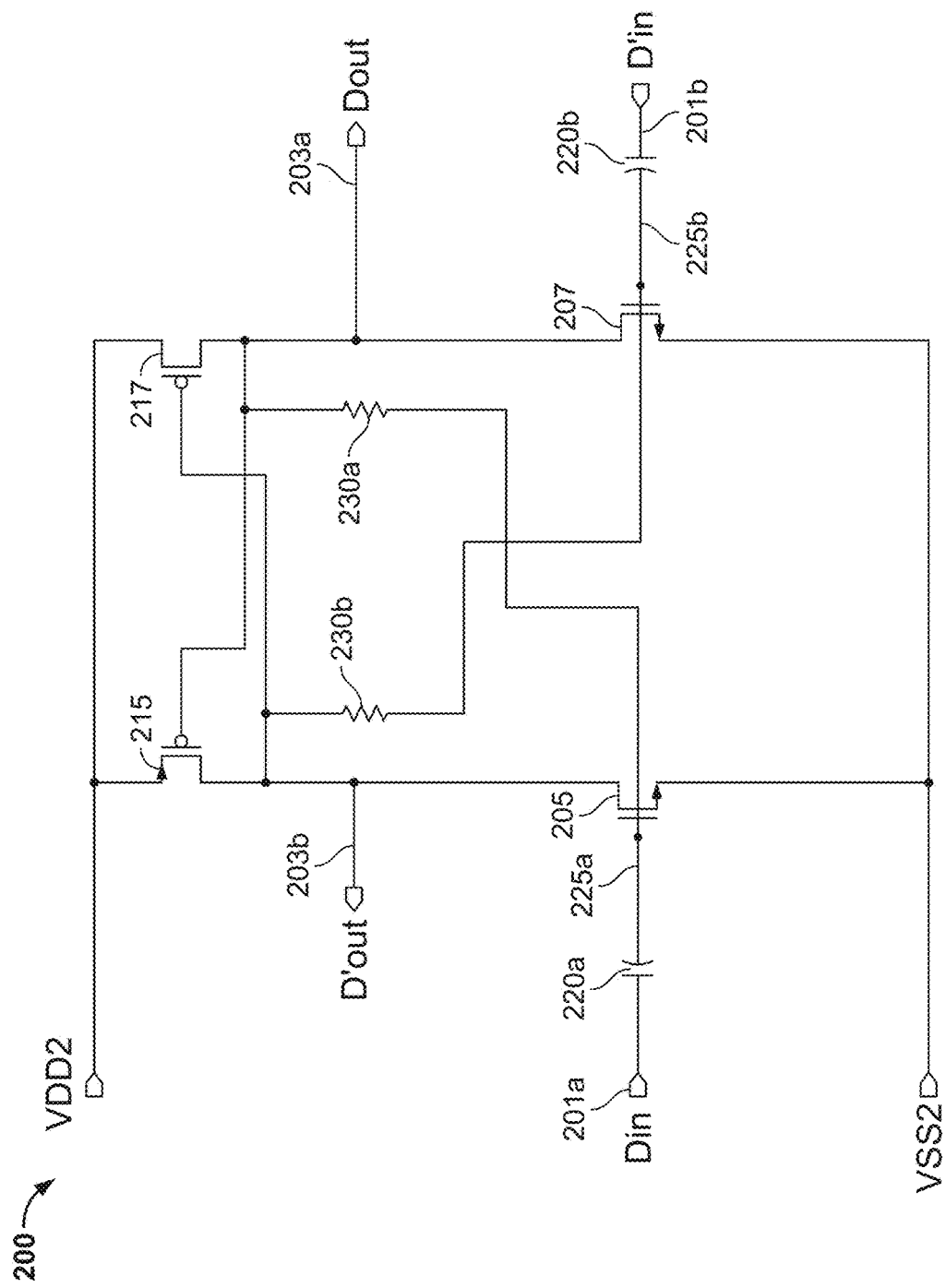
FIG. 2A is a schematic of another level-shifter circuit, according to some embodiments.

Referring to FIG. 2A, in some embodiments, a level-shifting circuit 200 may comprise a capacitive device 220 and a resistive device 230 coupled between an input terminal 201 and output terminal 203 of the circuit. In some embodiments, capacitive device 220 may be coupled between an input terminal 201 of the level-shifting circuit 200 and a gate terminal of a FET, and the resistive device 230 may be coupled between the gate terminal of the FET and an output terminal 203 of the level-shifting circuit 200.

In some embodiments, level-shifting circuit 200 may include differential input terminals (201a and 201b) and differential output terminals (203a and 203b). The differential input terminals may be configured to receive differential input signals from a first voltage domain (VDD1, VSS1), and the differential output terminals may be configured to provide differential output signals for a second voltage domain (VDD2, VSS2). For example, the differential input terminals may be configured to receive a digital signal Din and its inverse Din' having voltage levels compatible with the first voltage domain, and the differential output terminals may be configured to provide a digital signal Dout and its inverse Dout' having voltage levels compatible with the second voltage domain, where Din and Dout represent the same logical value. The differential input signals may be provided using any suitable technique.

In some embodiments, level-shifting circuit 200 may include a differential pair of transistors (205, 207) and a cross-coupled pair of transistors (215, 217). In some embodiments, the differential pair of transistors (205, 207) may comprise NFETs, and the cross-coupled pair of transistors (215, 217) may comprise PFETs. The gate terminal of transistor 205 may be coupled to a sense node 225a, which may be coupled to input terminal 201a through capacitive device 220a. The gate terminal of transistor 207 may be coupled to a sense node 225b, which may be coupled to input terminal 201b through capacitive device 220b. The source terminals of transistors 205 and 207 may be coupled to the ground voltage rail (VSS2) of the second voltage domain.

In some embodiments, a resistive device 230a may be coupled between sense node 225a and output terminal 203a. The drain terminals of transistors 217 and 207, and the gate terminal of transistor 215, may also be coupled to output terminal 203a. In some embodiments, a resistive device 230b may be coupled between sense node 225b and output terminal 203b. The drain terminals of transistors 215 and 205, and the gate terminal of transistor 217, may also be coupled to output terminal 203b. The source terminals of transistors 215 and 217 may be coupled to the supply voltage rail (VDD2) of the second voltage domain.

During steady-state operation, in the case where Din=logic-1 and Din'=logic-0, transistors 205 and 217 may be switched on, and transistors 207 and 215 may be switched off. Thus, output terminal 203a may be pulled up to VDD2, and output terminal 203b may be pulled down to VSS2. Accordingly, Dout may be at a logic-1 level and Dout' may be at a logic-0 level. Furthermore, sense node 225b may be pulled up to VDD2 (e.g., approximately VDD2) through transistor 217, and sense node 225a may be pulled down to VSS2 (e.g., approximately VSS2) through transistor 205. Setting the sense nodes to the rail voltages associated with the second voltage domain may conserve power by ensuring that transistors 205 and 207 are, in the steady-state, fully switched on or fully switched off.

A non-limiting example of the response of circuit 200 to a change in the logical state of the input signal will now be described. When Din transitions from logic-1 (e.g., supply voltage VDD1 of the first voltage domain) to logic-0 (e.g., ground voltage VSS1 of the first voltage domain), the voltage at sense node 225a decreases by approximately the same amount (e.g., VDD1-VSS1). The change in the input voltage of Din is sensed at sense node 225a because (1) capacitive device 220a capacitively couples input terminal 201a to sense node 225a, and (2) resistive device 230a temporarily decouples sense node 225a from supply rail VDD2. Due to the decrease in the voltage of sense node 225a, transistor 205 begins to switch off, and the voltage of signal Dout at output terminal 203a begins to decrease. In response to the decrease in the voltage at output terminal 203a, transistor 215 begins to switch on.

Likewise, when Din' transitions from logic-0 (e.g., ground voltage VSS1 of the first voltage domain) to logic-1 (e.g., supply voltage VDD1 of the first voltage domain), the voltage at sense node 225b increases by approximately the same amount (e.g., VDD1-VSS1). The change in the input voltage of Din' is sensed at sense node 225b because (1) capacitive device 220b capacitively couples input terminal 201b to sense node 225b, and (2) resistive device 230b temporarily de-couples sense node 225b from ground rail VSS2. Due to the increase in the voltage of sense node 225b, transistor 207 begins to switch on, and the voltage of signal Dout' at output terminal 203b begins to increase. In response to the increase in the voltage at output terminal 203b, transistor 217 begins to switch off.

The above-described changes in the voltages at the output terminals of circuit 200 are examples of a feed-forward effect. In particular, the transitions at the circuit's input terminals 201 are fed forward to the circuit's output terminals 203 through the resistive devices 230, bypassing the paths through the FETs. Thus, when a rising edge is applied to input terminal 201a, the potential at corresponding output terminal 203a begins to rise even before FET 217 begins pulling the potential of output terminal 203a up to VDD2. Likewise, when a falling edge is applied to input terminal 201a, the potential at corresponding output terminal 203a begins to fall even before FET 207 begins pulling the potential of output terminal 203a down to VSS2. The feed-forward effect may decrease the propagation delay through the circuit by charging or discharging the capacitances at the circuit's output terminals before the FETs driving the output terminals begin to switch.

Ultimately, transistor 207 responds to the change in the circuit's inputs by switching on, thereby pulling terminal 203a down toward VSS2 and switching on transistor 215. The pulling down of terminal 203a toward VSS2 is facilitated by the feed-forward effect, whereby terminal 203a has already been pulled down to a voltage less than VDD2 in response to the decrease in the voltage at sense node 225a. Transistor 205 responds to the change in the circuit's inputs by switching off, thereby allowing transistor 215 to pull terminal 203b and sense node 225b up to VDD2. The pulling up of terminal 203b toward VDD2 is facilitated by the feed-forward effect, whereby terminal 203b has already been pulled up to a voltage greater than VSS2 in response to the increase in the voltage at sense node 225b. The pulling up of terminal 203b toward VDD2 switches off transistor 217, thereby allowing transistor 207 to pull terminal 203a and sense node 225a down to VSS2.

As indicated by the foregoing discussion, the capacitive devices 220 may facilitate the level-shifting operation by capacitively coupling the input terminals 201 to the corresponding sense nodes 220. Since the input terminals are capacitively coupled to the sense nodes, the alternating current (AC) portions of the input signals (Din, Din') are coupled to the corresponding sense nodes, but the direct current (DC) portions of the input signals are blocked, such that each capacitive device maintains a DC voltage between the corresponding input terminal 201 and sense node 225. The DC voltage across a capacitive device 220 may be equal (e.g., approximately equal) to the difference between the voltages of the input and output signals (e.g., Din and Dout) coupled by the capacitive device. The DC blocking performed by capacitive devices 220 may facilitate proper operation of the level-shifting circuit 200 by preventing a fight between level-shifting circuit 200 and the circuit driving input terminal 201 over the DC potential of the sense node 220.

Each of the capacitive devices 220 may comprise any suitable device configured to couple AC signals and block DC signals, including, without limitation, one or more capacitors, and/or one or more transistors configured to function as capacitor(s). The capacitance of capacitive device 220 may be (1) large enough for the capacitive device 220 to properly perform the above-described DC blocking function between input signal Din and output signal Dout (e.g., large enough to store a potential equal to the larger of VSS2-VSS1 or VDD2-VDD1), and (2) small enough to limit the RC time constant of circuit 200 to a sufficiently small value, such that the operating frequency of the level-shifting circuit exceeds a specified threshold. In some embodiments, the capacitance of capacitive device 220a (220b) may be at least two times the parasitic gate capacitance of transistor 205 (207). In some embodiments, the capacitance of capacitive device 220a (220b) may be between two times and ten times the parasitic gate capacitance of transistor 205 (207). In some embodiments, the capacitance of capacitive device 220a (220b) may be between five times and ten times the parasitic gate capacitance of transistor 205 (207). In some embodiments, the capacitance of capacitive device 220a (220b) may be between three times and thirty times the parasitic gate capacitance of transistor 205 (207). In some embodiments, the capacitance of capacitive device 220a (220b) may be between five times and thirty times the parasitic gate capacitance of transistor 205 (207).

As indicated by the foregoing discussion, the resistive devices 230 may facilitate the level-shifting operation by temporarily decoupling the output terminals 203 from the sense nodes 225, thereby permitting the voltages of the sense nodes to change in response to changes in the voltages at the input terminals 201. If the sense nodes 225 were directly coupled to the output terminals 203, rather than being indirectly coupled to the output terminals through the resistive devices 230, then each of the sense nodes would be strongly pulled up to VDD2 or pulled down to VSS2, which would make it difficult for the voltages of the sense nodes to change in response to changes in the voltages at the input terminals. The resistive devices 230 also provide a feedback path from the output terminals 203 to the sense nodes 225, whereby the sense nodes are pulled up or down to the potentials of the power supply rails when the circuit stabilizes after a transition in the input signal.

Each of the resistive devices 230 may comprise any suitable device configured to temporarily decouple a sense node 225 from an output terminal 203, including, without limitation, one or more resistors, one or more transistors (e.g., biased in the linear region), and/or one or more switches. In some embodiments, the resistance of resistive device 230 may be (1) large enough for the resistive device 230 to properly perform the above-described decoupling function between sense node 225 and output terminal 203 (e.g., large enough to decouple the sense node from VDD2 and from VSS2), and (2) small enough to limit the RC time constant of circuit 200 to a sufficiently small value, such that the operating frequency of the level-shifting circuit exceeds a specified threshold. In some embodiments, the resistance of resistive device 220a (220b) may be between 50 ohms and 100,000 ohms. The resistance may be selected based, at least in part, on the desired speed of operation for the circuit, the amount of parasitic capacitance in the circuit, and/or the technology node (e.g., 15 nm-350 nm) in which the circuit is fabricated.

As indicated by the foregoing discussion, the operating frequency of level-shifting circuit 200 may depend on the RC time constant along the path from input terminal 201 to output terminal 203. In some embodiments, when circuit 200 is implemented in the 28 nm technology node or in a larger technology node (e.g., the 180 nm node), the RC time constant along the path through capacitive device 220 and resistive device 230 may be less than or equal to 500 picoseconds, less than or equal to 100 picoseconds, less than or equal to 50 picoseconds, and/or approximately equal to 10 picoseconds. In some embodiments, the RC time constant may be less than 10 picoseconds when circuit 200 is implemented in a technology node smaller than the 28 nm node (e.g., in a 22 nm node, a 15 nm node, a 10 nm node, a 7 nm node, or a 5 nm node). The RC time constant may decrease in successively smaller technology nodes because (1) the parasitic gate capacitances of the transistors may decrease, thereby facilitating decreases in the capacitances of the capacitive devices 220, and/or (2) the difference between the voltage levels corresponding to logic-1 and logic-0 may decrease, thereby facilitating decreases in the resistances of the resistive devices 230. Likewise, the RC time constant may increase in successively larger technology nodes.

In some embodiments, level-shifting circuit 200 may be faster (e.g., operate reliably at a higher frequency, and/or operate with a lower propagation delay between input and output terminals) than level-shifting circuit 100 and/or conventional level-shifting circuits, for at least three reasons. First, the transistors of level-shifting circuit 200 may be implemented in core logic (e.g., core CMOS) rather than I/O logic, because the maximum voltage drop across the drain-source terminals of any transistor in level-shifting circuit 200 may be limited to VDD2-VSS2. Second, the worst-case delay through circuit 200 includes the switching speeds of two transistors, in contrast to the four transistors of circuit 100. Third, the feed-forward configuration of circuit 200 accelerates the switching of the cross-coupled transistors (215, 217), because the feed-forward effect begins to charge or discharge the capacitances at the output terminals (203) even before the cross-coupled transistors begin to switch.

In a 28 nm or larger (e.g., 180 nm) technology node, some embodiments of level-shifting circuit 200 may reliably operate at frequencies between 1 MHz and 100 GHz, between 1 GHz and 100 GHz, or between 10 GHz and 100 GHz. In a technology node smaller than 28 nm (e.g., 22 nm, 15 nm, 10 nm, 7 nm, or 5 nm), some embodiments of level-shifting circuit 200 may reliably operate at frequencies even greater than 10 GHz (e.g., between 10 GHz and 200 GHz). In cases where level-shifting circuit 200 and level-shifting circuit 100 are implemented in the same technology node, level-shifting circuit 200 may reliably operate at higher frequencies (e.g., frequencies tens or hundreds of times higher) than level-shifting circuit 100. Alternatively, when level-shifting circuit 200 is included as a component of a system that operates at a lower frequency (e.g., 50 MHz-150 MHz), the reduced propagation delay of the level-shifting circuit, relative to conventional level-shifters, may facilitate design and implementation of other components of the system by increasing the slack in the critical timing path.

Figure 2B:
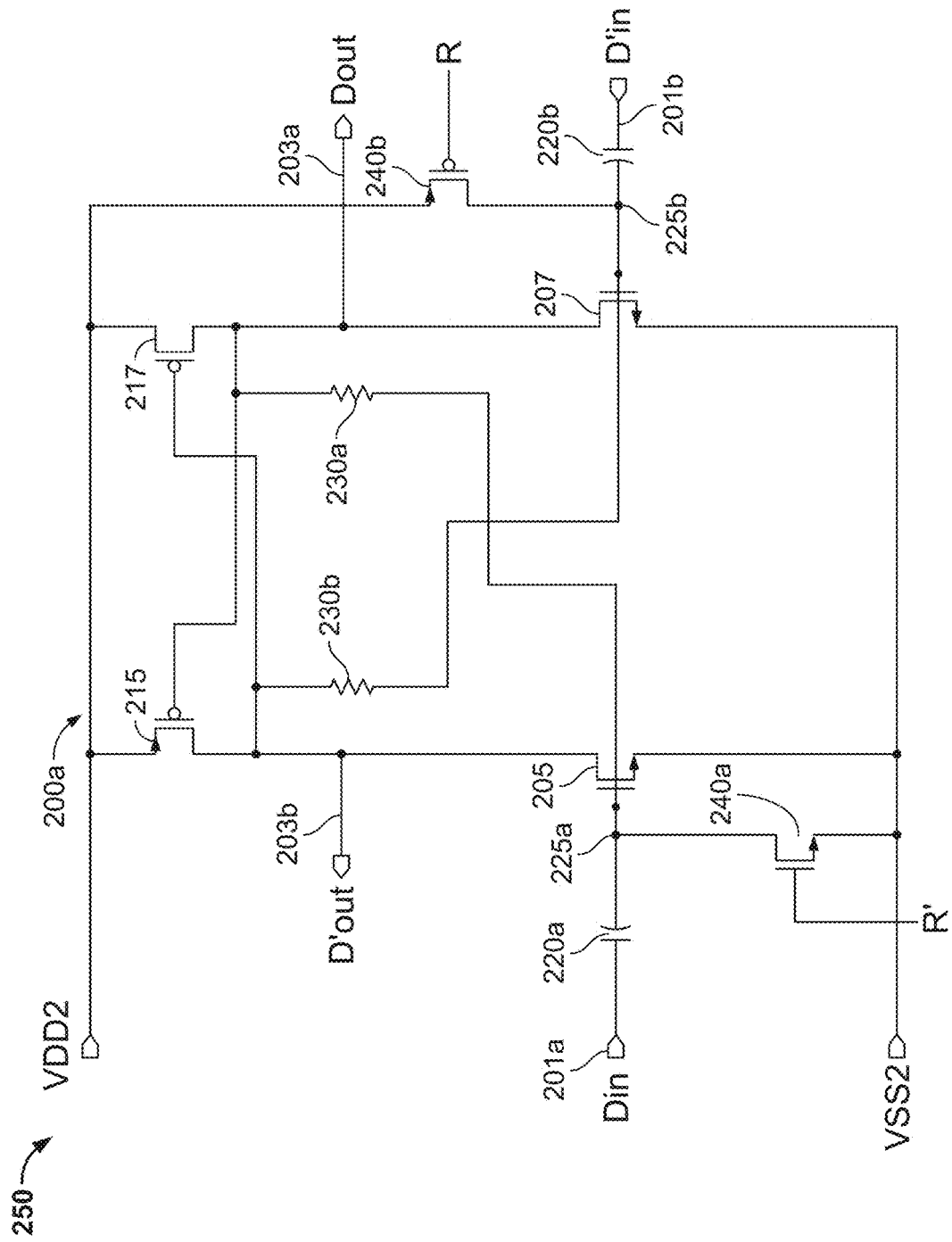
FIG. 2B is a schematic of the level-shifter circuit of FIG. 2A with reset circuitry, according to some embodiments.

Referring to FIG. 2B, in some embodiments, a level-shifting circuit 250 comprises a level-shifting circuit 200a and reset circuitry (240a, 240b). The reset circuitry may set level-shifting circuit 200a to a particular state (e.g., a state in which output signals Dout and Dout' are set to logic-0 and logic-1, respectively). In some embodiments, the reset circuitry may be used to ensure that level-shifting circuit 200a is in a known state during a reset operation (e.g., while a device comprising level-shifting circuit 200a is powering on). Setting the level-shifting circuit 200a to a known state during a reset operation may conserver power (e.g., by ensuring that devices coupled to the output of level-shifting circuit 200a remain switched off until the reset operation is complete). In applications where the level-shifting circuit 200a is used to control large devices (e.g., high-voltage devices and/or high-power devices), setting the output of circuit 200a to a known state during reset may conserve substantial amounts of power. In some embodiments, a power train driver may include a level-shifting circuit. Power trains, which are sometimes used in switching regulator applications, generally include large power FETs and a power train driver. The power train driver may include a chain of buffers (e.g., a chain of buffers of increasing size) configured to turn the power FETs on and off. In some embodiments, a power train driver may include a level-shifting circuit at the front of the power train driver to control the power train.

A non-limiting example of the operation of reset circuitry (240a, 240b) will now be described. An electronic device may provide a "ready signal" R, which may have a logic-0 value during a reset operation and a logic-1 value when the reset operation is complete (e.g., when the device is ready for operation). In the example of FIG. 2B, when the value of ready signal R is set to logic-0, transistor 240a pulls sense node 225a down to VSS2, and transistor 240b pulls sense node 225b up to VDD2, thereby ensuring that output signals Dout and Dout' are set to logic-0 and logic-1, respectively. One of ordinary skill in the art would understand that the reset circuitry could alternatively be configured to hold Dout and Dout' at logic-1 and logic-0, respectively, by attaching the drain terminal of pull-up transistor 240b to sense node 225a and attaching the drain terminal of pull-down transistor 240a to sense node 225b.

Figure 2C:
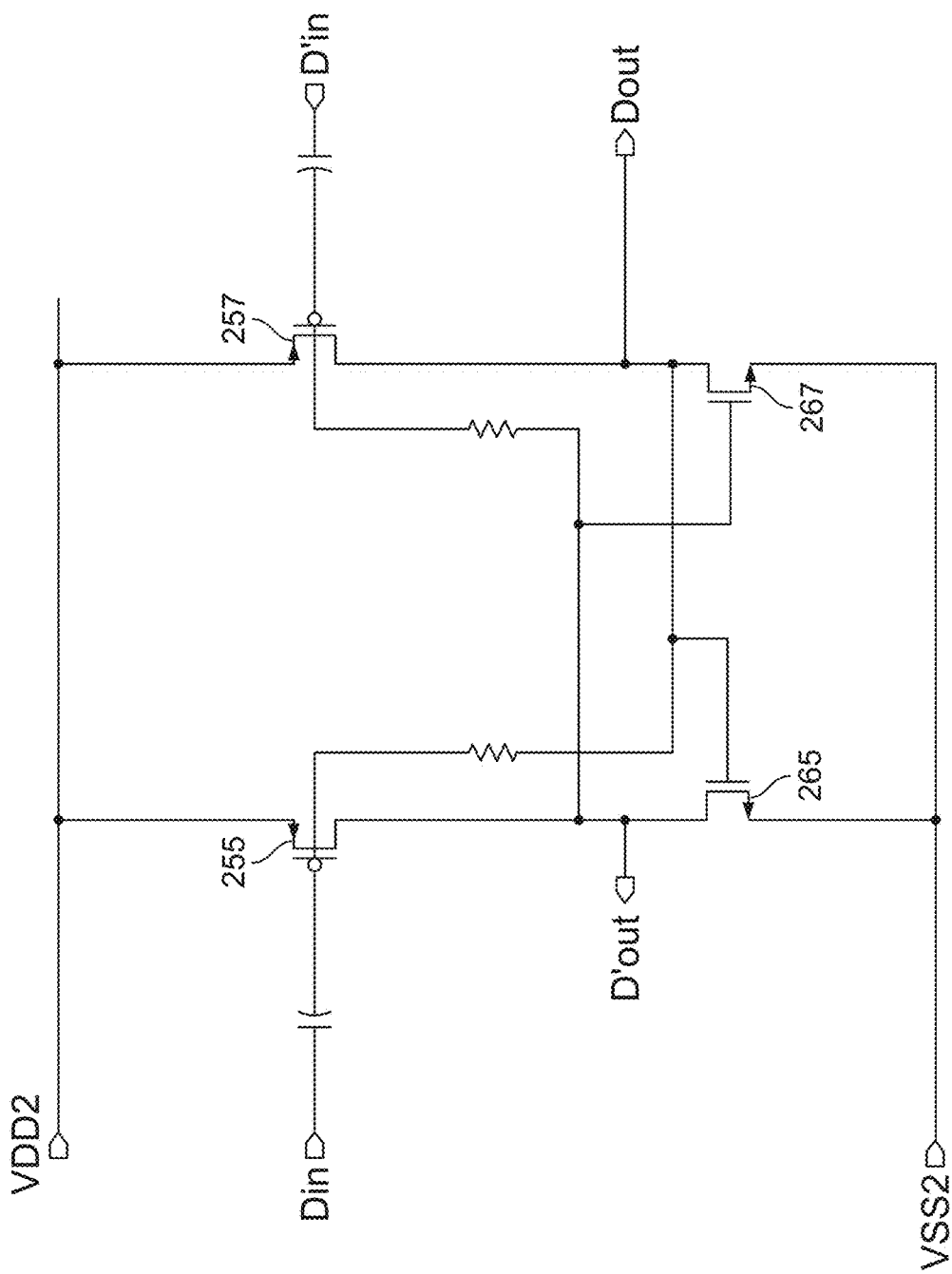
FIG. 2C is a schematic of another level-shifter circuit, according to some embodiments.

Referring to FIG. 2C, in some embodiments, a level-shifting circuit 290 may include a differential pair of PFETs (255, 257) and a cross-coupled pair of NFETs (265, 267). One of ordinary skill in the art would understand, based on the foregoing description of level-shifting circuit 200, how level-shifting circuit 290 operates.

Referring to FIG. 3, in some embodiments, a level-shifting circuit 300 with a single-ended input Din may comprise a capacitive device 320 and a resistive device 330 coupled between an input terminal 301 and output terminal 303 of the circuit. In some embodiments, capacitive device 320 may be coupled between input terminal 301 of the level-shifting circuit 300 and an input terminal of an inverter 302, and the resistive device 330 may be coupled between the input terminal of the inverter 302 and the output terminal 303 of the level-shifting circuit 300.

In some embodiments, input terminal 301 may be configured to receive an input signal Din from a first voltage domain (VDD1, VSS1), and output terminal 303 may be configured to provide an output signal Dout for a second voltage domain (VDD2, VSS2). For example, input terminal 301 may be configured to receive a digital signal Din having voltage levels compatible with the first voltage domain, and output terminal 303 may be configured to provide a digital signal Dout having voltage levels compatible with the second voltage domain, where Din and Dout represent the same logical value. Input signal Din may be provided using any suitable technique. In some embodiments, level-shifting circuit 300 may include an output terminal 305 configured to provide a digital signal Dout' having voltage levels compatible with the second voltage domain, where Dout and Dout' represent opposite logical values.

In some embodiments, level-shifting circuit 300 may include at least two inverters (e.g., at least one inverter 302 having its input terminal coupled to sense node 325, and at least one inverter 304 having its output terminal coupled to sense node 325). The input terminal of inverter 302 may be coupled to input terminal 301 of circuit 300 through capacitive device 320. The output terminal of inverter 302 may be coupled to the input terminal of inverter 304 (e.g., directly coupled, or coupled through an even number of inverters). The output terminal of inverter 304 may be coupled to sense node 325 through resistive device 330.

The inverters may be implemented using any suitable technique. In some embodiments, one or more of the inverters (e.g., inverters 302 and 304) may be implemented as Schmitt triggers, which may provide additional noise immunity to sense node 325.

In some embodiments, sense node 325 may be capacitively coupled to supply rail VDD2 through a capacitive device 335a, and/or capacitively coupled to ground rail VSS2 through a capacitive device 335b. The capacitive devices 335 may be implemented using any suitable technique. In some embodiments, one or more of the capacitive devices 335 may include one or more capacitors, and/or one or more transistors configured to function as capacitors. In some embodiments, capacitive devices 335a and 335b may be omitted, as may the illustrated couplings between sense node 325 and rails VDD2 and VSS2.

During steady-state operation, in the case where Din=logic-0, the output of inverter 302 is logic-1 (approximately VDD2), and the output of inverter 304 is logic-0 (approximately VSS2). Furthermore, sense node 325 may be discharged to VSS2 (e.g., approximately VSS2) through inverter 304. Setting the sense node to one of the rail voltages of the second voltage domain may conserve power by ensuring that the components of inverters 302 and 304 are, in the steady-state, fully switched on or fully switched off.

A non-limiting example of the response of circuit 300 to a change in the logical state of the input signal will now be described. When Din transitions from logic-0 (e.g., ground voltage VSS1 of the first voltage domain) to logic-1 (e.g., supply voltage VDD1 of the first voltage domain), the voltage at sense node 325 increases by approximately the same amount (e.g., VDD1-VSS1). The change in the input voltage of Din is sensed at sense node 325 because (1) capacitive device 320 capacitively couples input terminal 301 to sense node 325, and (2) resistive device 330 temporarily decouples sense node 325 from supply rail VSS2. Due to the increase in the voltage of sense node 325, the components of inverter 302 begin to switch, and the voltage of signal Dout at output terminal 303 begins to increase.

The increase in the voltage at output terminal 303 of circuit 300 is an example of a feed-forward effect, because the output of circuit 300 begin to transition to its next value in response to the corresponding changes in the circuit's input, even as the components of circuit 300 (e.g., inverters 302 and 304) are still responding to the changes in the circuit's input.

Ultimately, inverter 302 responds to the change in the circuit's input by pulling terminal 305 down to VSS2. Inverter 304 responds to the change in voltage of terminal 305 by pulling terminal 303 up to VDD2. The pulling up of terminal 303 toward VDD2 is facilitated by the feed-forward effect, whereby terminal 303 has already been pulled up to a voltage greater than VSS2 in response to the increase in the voltage at sense node 325.

Capacitive device 320 may facilitate the level-shifting operation by capacitively coupling input terminal 301 to sense node 320. Since the input terminal is capacitively coupled to the sense node, the AC portion of the input signal is coupled to the sense node, but the DC portion of the input signals is blocked, such that capacitive device 320 maintains a DC voltage between input terminal 301 and sense node 325. The DC voltage across capacitive device 320 may be equal (e.g., approximately equal) to the difference between the voltages of the input and output signals (e.g., Din and Dout) coupled by the capacitive device. The DC blocking performed by capacitive device 320 may facilitate proper operation of the level-shifting circuit 300 by preventing a fight between inverter 304 and the circuit driving input terminal 301 over the DC potential of the sense node 320.

Capacitive device 320 may comprise any suitable device configured to couple AC signals and block DC signals, including, without limitation, one or more capacitors, and/or one or more transistors configured to function as capacitor(s). The capacitance of capacitive device 320 may be (1)

large enough for the capacitive device 320 to properly perform the above-described DC blocking function between input signal Din and output signal Dout (e.g., large enough to store a potential equal to the larger of VSS2-VSS1 or VDD2-VDD1), and (2) small enough to limit the RC time constant of circuit 300 to a sufficiently small value, such that the operating frequency of the level-shifting circuit exceeds a specified threshold. In some embodiments, the capacitance of capacitive device 320 may be at least two times the sum of the parasitic capacitance at the input terminal of inverter 302 and the capacitances of the capacitive devices 335 (if any). In some embodiments, the capacitance of capacitive device 320 may be between two times and ten times the sum of the parasitic capacitance at the input terminal of inverter 302 and the capacitances of the capacitive devices 335 (if any). In some embodiments, the capacitance of capacitive device 320 may be between five times and thirty times the sum of the parasitic capacitance at the input terminal of inverter 302 and the capacitances of the capacitive devices 335 (if any). In some embodiments, the capacitance of capacitive device 320 may be at least five times greater or thirty times greater than the sum of the parasitic capacitance at the input terminal of inverter 302 and the capacitances of the capacitive devices 335 (if any). In some embodiments, the capacitive devices 335 may be eliminated and the capacitance of capacitive device 320 may be between three times and thirty times the parasitic capacitance at the input of inverter 302.

Resistive device 330 may facilitate the level-shifting operation by temporarily decoupling the output terminal 303 from the sense node 325, thereby permitting the voltage of the sense node to change in response to a change in the voltage at input terminal 301. If sense node 325 were directly coupled to output terminal 303, rather than being indirectly coupled to the output terminal through resistive device 330, then the sense node would be strongly pulled up to VDD2 or pulled down to VSS2, making it difficult for the voltage of the sense node to change in response to changes in the voltage at the input terminal. Resistive device 330 also provide a feedback path from the output terminal 303 to the sense node 325, whereby the sense node is pulled up or down to the potential of the power supply rail when the circuit stabilizes after a transition in the input signal.

Resistive device 330 may comprise any suitable device configured to temporarily decouple a sense node 325 from an output terminal 303, including, without limitation, one or more resistors, one or more transistors (e.g., biased in the linear region), and/or one or more switches. In some embodiments, the resistance of resistive device 330 may be (1) large enough for the resistive device 330 to properly perform the above-described decoupling function between sense node 325 and output terminal 303 (e.g., large enough to decouple the sense node from VDD2 and from VSS2), and (2) small enough to limit the RC time constant of circuit 300 to a sufficiently small value, such that the operating frequency of the level-shifting circuit exceeds a specified threshold. In some embodiments, the resistance of resistive device 330 may be between 50 ohms and 100,000 ohms. The resistance may be selected based, at least in part, on the desired speed of operation for the circuit, the amount of parasitic capacitance in the circuit, and/or the technology node (e.g., 15 nm-350 nm) in which the circuit is fabricated.

The operating frequency of level-shifting circuit 300 may depend on the RC time constant along the path from input terminal 301 to output terminal 303. In some embodiments, when circuit 300 is implemented in the 28 nm technology node or in a larger technology node (e.g., the 180 nm node), the RC time constant along the path through capacitive device 320 and resistive device 330 may be less than or equal to 500 picoseconds, less than or equal to 100 picoseconds, less than or equal to 50 picoseconds, and/or approximately equal to 10 picoseconds. In some embodiments, the RC time constant may be less than 10 picoseconds when circuit 300 is implemented in a technology node smaller than the 28 nm node (e.g., in a 22 nm node, a 15 nm node, a 10 nm node, a 7 nm node, or a 5 nm node). The RC time constant may decrease in successive technology nodes because (1) the parasitic capacitance at the input of inverter 302 may decrease, thereby facilitating a decrease in the capacitance of capacitive device 320, and/or (2) the difference between the voltage levels corresponding to logic-1 and logic-0 may decrease, thereby facilitating a decrease in the resistance of the resistive device 330. Likewise, the RC time constant may increase in successively larger technology nodes.

In some embodiments, level-shifting circuit 300 may be faster (e.g., operate reliably at a higher frequency) than level-shifting circuit 100 and/or conventional level-shifting circuits, for at least three reasons. First, the transistors of level-shifting circuit 300 (e.g., the transistors of inverters 302 and 304) may be implemented in core logic (e.g., core CMOS) rather than I/O logic, because the voltage drop across the drain-source terminals of any transistor in level-shifting circuit 300 is limited to VDD2-VSS2. Second, the worst-case delay through circuit 300 includes the switching speeds of two transistors, in contrast to the four transistors of circuit 100. Third, the feed-forward configuration of circuit 300 accelerates the switching of inverter 304, because the feed-forward effect begins to charge or discharge the capacitance at the output terminal (303) even before inverter 304 begins to switch.

In a 28 nm or larger (e.g., 180 nm) technology node, some embodiments of level-shifting circuit 300 may reliably operate at frequencies between 1 MHz and 100 GHz, between 1 GHz and 100 GHz, or between 10 GHz and 100 GHz. In a technology node smaller than 28 nm (e.g., 22 nm, 15 nm, 10 nm, 7 nm, or 5 nm), some embodiments of level-shifting circuit 300 may reliably operate at frequencies greater than 100 GHz (e.g., between 100 GHz and 200 GHz). In cases where level-shifting circuit 300 and level-shifting circuit 100 are implemented in the same technology node, level-shifting circuit 300 may reliably operate at higher frequencies (e.g., frequencies tens or hundreds of times higher) than level-shifting circuit 100. Alternatively, when level-shifting circuit 300 is included as a component of a system that operates at a lower frequency (e.g., 50 MHz-150 MHz), the reduced propagation delay of the level-shifting circuit, relative to conventional level-shifters, may facilitate design and implementation of other components of the system by increasing the slack in the critical timing path.

Referring to FIG. 3, in some embodiments, level-shifting circuit 300 comprises reset circuitry 340. Reset circuitry 340 may set level-shifting circuit 300 to a particular state (e.g., a state in which output signals Dout and Dout' are set to logic-0 and logic-1, respectively). Some benefits of setting the outputs of a level-shifting circuit to a known state during a reset operation are described above with reference to FIG. 2B.

A non-limiting example of the operation of reset circuitry 340 will now be described. An electronic device may provide a "ready signal" R, which may have a logic-0 value during a reset operation and a logic-1 value when the reset operation is complete (e.g., when the device is ready for operation). In the example of FIG. 3, when the value of ready signal R is set to logic-0, transistor 342 pulls sense node 325 down to VSS2, thereby ensuring that output signals Dout and Dout' are set to logic-0 and logic-1, respectively. One of ordinary skill in the art would understand that the reset circuitry could alternatively be configured to hold Dout and Dout' at logic-1 and logic-0, respectively, by attaching the drain terminal of a pull-up transistor to sense node 325 and using ready signal R to control the gate of the pull-up transistor.

Figure 4:
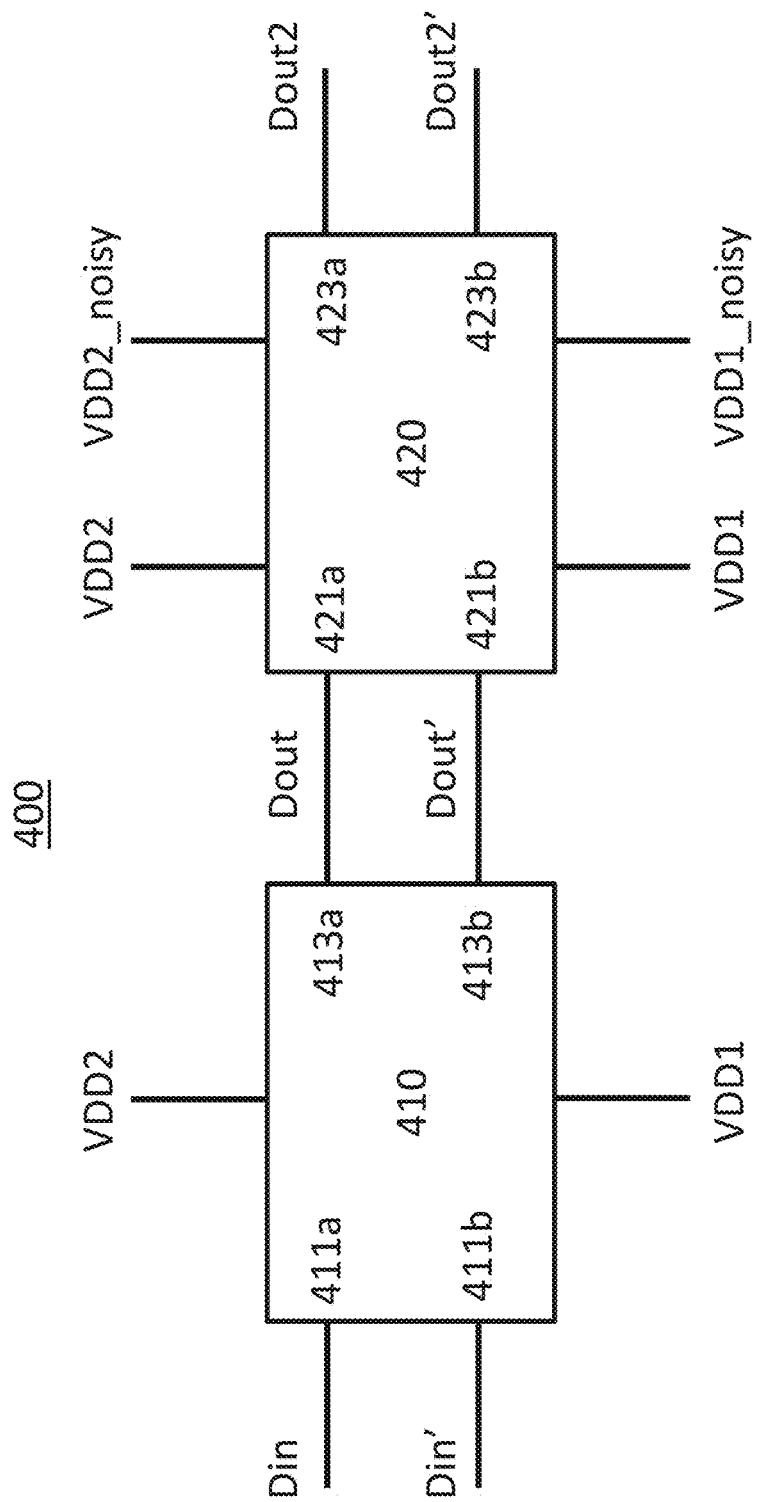
FIG. 4 is a block diagram of another level-shifter circuit, according to some embodiments.

Referring to FIG. 4, in some embodiments, a level-shifting circuit 400 includes a first level-shifting circuit 410 and a second level-shifting circuit 420 coupled in a cascade configuration, with the differential data outputs 413 of the first level-shifting circuit 410 coupled to the differential data inputs 421 of the second level-shifting circuit. In some embodiments, level-shifting circuit 400 may provide improved immunity to power supply noise. In some embodiments, level-shifting circuit 400 may be used to perform level-shifting in a switching regulator, in a power supply voltage regulator, or in any device in which immunizing the level-shifting circuit from power supply noise is important.

In some embodiments, first level-shifting circuit 410 may receive a differential pair of input signals (Din and Din') from a first voltage domain (VDD1, VSS1) at input terminals 411a and 411b, may convert the input signals to a second voltage domain (VDD2, VDD1), and may provide the converted signals (Dout, Dout') at output terminals 413a and 413b. In some embodiments, first level-shifting circuit 410 may comprise a level-shifting circuit 200 or 250 as described herein. The positive and negative power supply rails of the first level-shifting circuit 410 may be coupled to supply voltage VDD2 and ground voltage VDD1, respectively. Although first level-shifting circuit 410 is illustrated as having differential input terminals 411a and 411b in FIG. 4, in some embodiments, first level-shifting circuit 410 have a single-ended input, and may comprise a level-shifting circuit 300 as described herein.

In some embodiments, second level-shifting circuit 420 may receive the differential pair of output signals (Dout and Dout') provided by first level-shifting circuit 410 at input terminals 421a and 421b, may convert the signals Dout and Dout' from the second voltage domain (VDD2, VDD1) to a third voltage domain (VDD2_noise, VDD1_noisy), and may provide the converted signals (Dout2, Dout2') at output terminals 423a and 423b. In some embodiments, second level-shifting circuit 420 may comprise a level-shifting circuit 100 as described herein, or any suitable multi-stage level-shifting circuit. In some embodiments, second level-shifting circuit 420 may comprise components arranged as in level-shifting circuit 100, but with the transistors implemented in core logic rather than I/O logic. Implementing the transistors of level-shifting circuit 420 in core logic rather than I/O logic may increase the frequency of level-shifting circuit 400 without risking damage to the components, since the maximum voltage drop across the transistors of level-shifting circuit 420 is approximately VDD2-VDD1.

In some embodiments, the positive and negative power supply rails of the input stage of level-shifting circuit 420 may be coupled to VDD2 and VDD1, respectively, and the positive and negative power supply rails of the output stage of level-shifting circuit 420 may be coupled to VDD2_noisy and VDD1_noisy, respectively. In some embodiments, the second and third voltage domains may have the same nominal voltages (e.g., supply voltages VDD2 and VDD2_noisy may have approximately the same nominal voltage value, and ground voltages VDD1 and VDD1_noisy may have approximately the same nominal voltage value), but the third voltage domain may be more noisy than the second voltage domain (e.g., supply voltage VDD2_noisy may be more noisy than supply voltage VDD2, and/or ground voltage VDD1_noisy may be more noisy than ground voltage VDD1). For example, the power supply for the third voltage domain may also supply power to high-power components (e.g., power FETs), which may introduce large voltage swings (e.g., ringing) into supply voltage VDD2_noisy and/or ground voltage VDD1_noisy when the high-power components switch on or off.

By isolating the power supply of the first level-shifting circuit 410 from the noisy power supply, the second level-shifting circuit 420 may improve the functioning of the first level-shifting circuit 410. As described above, level-shifting circuit 410 may comprise a single-stage level-shifting circuit 200, 250, or 300. In some embodiments, the single-stage level-shifting circuits may be sensitive to noise in the level-shifting circuit's power supply (e.g., because these circuits may have capacitively-coupled inputs and sense nodes with memory). Thus, the noise immunity provided by second level-shifting circuit 420 may improve the operation of first level-shifting circuit 410 in circuits where a noisy power supply is present (e.g., in a power supply voltage regulator).

Further Description of Some Embodiments

Embodiments have been described in which a level-shifting circuit performs a level-shifting operation on a digital input signal. In some embodiments, the level-shifting techniques and devices described herein may be used to perform level-shifting operations on analog input signals.

Embodiments have been described in which a level-shifting circuit exhibits a feed-forward effect, whereby the output of the level-shifting circuit begins to switch even before a change at the input of the level-shifting circuit has fully propagated through the level-shifting circuit's transistors. In some embodiments, decreasing the resistance of a resistive device coupled between a level-shifting circuit's sense node and output terminal may facilitate the feed-forward effect by enhancing the coupling between the sense node and the output terminal, at the expense of decreasing the sense node's sensitivity to changes in the potential of the level-shifting circuit's input terminal. Conversely, in some embodiments, increasing the resistance of a resistive device coupled between a level-shifting circuit's sense node and output terminal may increase the sense node's sensitivity to changes in the potential of the level-shifting circuit's input terminal, at the expense of inhibiting the feed-forward effect by weakening the coupling between the sense node and the output terminal. The resistance of the resistive device may be selected so as to balance or trade off these competing considerations.

Circuits have been described in which one or more FETs are implemented in "I/O logic" and/or one or more FETs are implemented in "core logic." The switching speed of a FET is generally inversely proportional to the FET's breakdown voltage. Furthermore, FETs with higher breakdown voltages are generally used for input/output functions, and FETs with lower breakdown voltages are generally used for core processing functions. Thus, the phrase "I/O FET" or "FET implemented in I/O logic" generally refers to a FET with a relatively high breakdown voltage, and the phrase "core FET" or "FET implemented in core logic" generally refers to a FET with a relatively low breakdown voltage. In some embodiments, the phrase "I/O FET" or "FET implemented in I/O logic" refers to a FET with a high breakdown voltage relative to the difference between the supply and ground voltages of the FET's voltage domain. In some embodiments, the phrase "core FET" or "FET implemented in core logic" refers to a FET with a breakdown voltage substantially equal to or not much greater than the difference between the supply and ground voltages of the FET's voltage domain.

Terminology

The phraseology and terminology used herein is for the purpose of description and should not be regarded as limiting.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of or "exactly one of," or, when used in the claims, "consisting of," will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

Equivalents

The invention can be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are therefore intended to be embraced therein.

What is claimed is:

1. A level-shifter circuit comprising:
first and second field-effect transistors (FETs) of a first type, wherein source terminals of the first and second FETs are configured to couple to a voltage supply at a first potential;
a first capacitive device coupled between a gate terminal of the first FET and a first differential input terminal of the level-shifter circuit;
a second capacitive device coupled between a gate terminal of the second FET and a second differential input terminal of the level-shifter circuit;
third and fourth FETs of a second type coupled to form a cross-coupled transistor pair, wherein a drain terminal of the third FET is coupled to a gate terminal of the fourth FET, wherein a drain terminal of the fourth FET is coupled to a gate terminal of the third FET, wherein source terminals of the third and fourth FETs are configured to couple to a voltage supply at a second potential, and wherein the drain terminal of the fourth FET is coupled to a differential output terminal of the level-shifter circuit;
a first resistive device coupled between the drain terminal of the third FET and the gate terminal of the second FET; and
a second resistive device coupled between the drain terminal of the fourth FET and the gate terminal of the first FET,
wherein the second resistive device is configured to conductively couple the first differential input terminal and the differential output terminal.

2. The level-shifter circuit of claim 1, wherein the first type comprises an NMOS type, and wherein the second type comprises a PMOS type.

3. The level-shifter circuit of claim 1, wherein the first type comprises a PMOS type, and wherein the second type comprises an NMOS type.

4. The level-shifter circuit of claim 1, wherein at least one of the first FET and the second FET is implemented in core logic, and wherein at least one of the third FET and the fourth FET is implemented in core logic.

5. The level-shifter circuit of claim 1, wherein a propagation delay between the first differential input terminal and the output terminal of the level shifter circuit is between 5 picoseconds and 100 picoseconds.

6. The level-shifter circuit of claim 1, wherein a capacitance of the first capacitive device is between 3 times and 30 times a parasitic gate capacitance of the first FET.

7. The level-shifter circuit of claim 6, wherein a capacitance of the second capacitive device is between 3 times and 30 times a parasitic gate capacitance of the second FET.

8. The level-shifter circuit of claim 1, wherein the differential output terminal is a first differential output terminal, the level-shifter circuit further comprising second differential output terminal, wherein the drain terminal of the first FET is coupled to the drain terminal of the third FET, wherein the drain terminal of the second FET is coupled to the drain terminal of the fourth FET, wherein the first differential output terminal is coupled to the drain terminals of the second and fourth FETs, and wherein the second differential output terminal is coupled to the drain terminals of the first and third FETs.

9. The level-shifter circuit of claim 1, wherein the differential output terminal is a first differential output terminal, wherein the drain terminal of the third FET is coupled to a second differential output terminal of the level-shifter circuit, and wherein the first and second differential output terminals are coupled to respective input terminals of another level-shifting-device.

10. The level-shifter circuit of claim 9, wherein the other level-shifting device comprises a multi-stage level-shifting device.

11. The level-shifter circuit of claim 1, further comprising reset circuitry configured to set the potential of a node between the first capacitive device and the second resistive device to the first potential or the second potential in response to a reset control signal.

12. A power train device, comprising:
a level-shifter circuit including:
first and second field-effect transistors (FETs) of a first type, wherein source terminals of the first and second FETs are configured to couple to a voltage supply at a first potential;
a first capacitive device coupled between a gate terminal of the first FET and a first differential input terminal of the level-shifter circuit;
a second capacitive device coupled between a gate terminal of the second FET and a second differential input terminal of the level-shifter circuit;
third and fourth FETs of a second type coupled to form a cross-coupled transistor pair, wherein a drain terminal of the third FET is coupled to a gate terminal of the fourth FET, wherein a drain terminal of the fourth FET is coupled to a gate terminal of the third FET, wherein source terminals of the third and fourth FETs are configured to couple to a voltage supply at a second potential, and wherein the drain terminal of the fourth FET is coupled to a differential output terminal of the level-shifter circuit;

a first resistive device coupled between the drain terminal of the third FET and the gate terminal of the second FET; and
a second resistive device coupled between the drain terminal of the fourth FET and the gate terminal of the first FET,
wherein the second resistive device is configured to conductively couple the first differential input terminal and the differential output terminal.

13. The power train device of claim 12, wherein the first type comprises an NMOS type, and wherein the second type comprises a PMOS type.

14. The power train device of claim 12, wherein the first type comprises a PMOS type, and wherein the second type comprises an NMOS type.

15. The power train device of claim 12, wherein at least one of the first FET and the second FET is implemented in core logic, and wherein at least one of the third FET and the fourth FET is implemented in core logic.

16. The power train device of claim 12, wherein a propagation delay between the first differential input terminal and the output terminal of the level shifter circuit is between 5picoseconds and 100 picoseconds.

17. The power train device of claim 12, wherein a capacitance of the first capacitive device is between 3 times and 30 times a parasitic gate capacitance of the first FET.

18. The power train device of claim 17, wherein a capacitance of the second capacitive device is between 3 times and 30 times a parasitic gate capacitance of the second FET.

19. The power train device of claim 12, wherein the differential output terminal is a first differential output terminal, the level-shifter circuit further comprising second differential output terminal, wherein the drain terminal of the first FET is coupled to the drain terminal of the third FET, wherein the drain terminal of the second FET is coupled to the drain terminal of the fourth FET, wherein the first differential output terminal is coupled to the drain terminals of the second and fourth FETs, and wherein the second differential output terminal is coupled to the drain terminals of the first and third FETs.

20. The power train device of claim 12, wherein the differential output terminal is a first differential output terminal, wherein the drain terminal of the third FET is coupled to a second differential output terminal of the level-shifter circuit, and wherein the first and second differential output terminals are coupled to respective input terminals of another level-shifting device.

21. The power train device of claim 20, wherein the other level-shifting device comprises a multi-stage level-shifting device.

22. The power train device of claim 12, further comprising reset circuitry configured to set the potential of a node between the first capacitive device and the second resistive device to the first potential or the second potential in response to a reset control signal.

* * * * *